(12) United States Patent
Zhang (10) Patent No.: US 11,215,894 B2
(45) Date of Patent: Jan. 4, 2022

(54) DISPLAY PANEL, METHOD FOR MANUFACTURING DISPLAY PANEL, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventor: Di Zhang, Beijing (CN)

(73) Assignees: BEIJING BOE DISPLAY TECHNOLOGY CO., LTD, Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 229 days.

(21) Appl. No.: 16/611,647

(22) PCT Filed: Jan. 3, 2019

(86) PCT No.: PCT/CN2019/070190
§ 371 (c)(1),
(2) Date: Nov. 7, 2019

(87) PCT Pub. No.: WO2019/184543
PCT Pub. Date: Oct. 3, 2019

(65) Prior Publication Data
US 2021/0325751 A1 Oct. 21, 2021

(30) Foreign Application Priority Data
Mar. 26, 2018 (CN) .......................... 201810256464.7

(51) Int. Cl.
*H01L 51/52* (2006.01)
*G02F 1/1362* (2006.01)
(Continued)

(52) U.S. Cl.
CPC .. *G02F 1/136295* (2021.01); *G02F 1/133354* (2021.01); *G02F 1/133388* (2021.01);
(Continued)

(58) Field of Classification Search
None
See application file for complete search history.

(56) References Cited

U.S. PATENT DOCUMENTS

| 5,282,068 A | 1/1994 | Inaba |
| 6,097,457 A | 8/2000 | Kim et al. |

(Continued)

FOREIGN PATENT DOCUMENTS

| CN | 205229635 U | 5/2016 |
| CN | 105676520 A | 6/2016 |

(Continued)

OTHER PUBLICATIONS

First Office Action and English language translation, CN Application No. 201810256464.7, dated Feb. 25, 2020, 18 pp.

*Primary Examiner* — Benjamin P Sandvik
(74) *Attorney, Agent, or Firm* — Myers Bigel, P.A.

(57) ABSTRACT

The present application discloses a display panel, a method for manufacturing a display panel, and a display device. The display panel includes a first substrate and a second substrate opposite the first substrate, a patterned black matrix layer between the first substrate and the second substrate, where the patterned black matrix layer includes a hollow area, and an array of signal lines on a side of the first substrate adjacent to the second substrate. The array of signal lines includes a feedback signal line for common electrode and a clock signal line. The display panel is divided into a display region in a center of the display panel and a frame region surrounding the display region. An orthographic projection of at least one of the first region and the second region on the (Continued)

first substrate at least partially overlaps an orthographic projection of the hollow area on the first substrate.

11 Claims, 9 Drawing Sheets

(51) Int. Cl.
  *H01L 27/12* (2006.01)
  *G02F 1/1333* (2006.01)
  *G02F 1/1335* (2006.01)

(52) U.S. Cl.
  CPC ...... *G02F 1/133512* (2013.01); *H01L 27/124* (2013.01); *H01L 27/1259* (2013.01); *H01L 51/5284* (2013.01)

(56) References Cited

U.S. PATENT DOCUMENTS

| | | | | |
|---|---|---|---|---|
| 2010/0013743 | A1* | 1/2010 | Cho | G02F 1/1345 345/55 |
| 2014/0028961 | A1* | 1/2014 | Yanagisawa | G02F 1/1368 349/106 |
| 2016/0126256 | A1 | 5/2016 | Hwang et al. | |
| 2016/0154261 | A1* | 6/2016 | Kim | G02F 1/133351 349/61 |
| 2017/0329164 | A1 | 11/2017 | Hao et al. | |
| 2018/0203287 | A1* | 7/2018 | Wang | G02F 1/13306 |
| 2021/0065646 | A1* | 3/2021 | Lv | G09G 3/20 |

FOREIGN PATENT DOCUMENTS

| | | |
|---|---|---|
| CN | 206162006 U | 5/2017 |
| CN | 106842678 A | 6/2017 |
| CN | 108398839 A | 8/2018 |

* cited by examiner

DISPLAY PANEL, METHOD FOR MANUFACTURING DISPLAY PANEL, AND DISPLAY DEVICE

RELATED APPLICATION

The present application is a 35 U.S.C. 371 national stage application of PCT International Application No. PCT/CN2019/070190, filed on Jan. 3, 2019, which claims the benefit of Chinese Patent Application No. 201810256464.7, filed on Mar. 26, 2018, the contents of which are incorporated herein by reference in its their entireties.

TECHNICAL FIELD

Embodiments of the present disclosure relate to the field of display technology, and in particular, to a display panel, a method for manufacturing the same, and a display device.

BACKGROUND

With the continuous development of Thin Film Transistor (TFT) liquid crystal display technology, TFT liquid crystal display devices with low power consumption, high resolution, fast response speed and high aperture ratio have gradually been mainstream, and have been widely used in various electronic devices, such as liquid crystal display (LCD) TVs, smart phones, tablets, and digital electronic devices.

It has been found that, in the current TFT liquid crystal display device, since coupling capacitance is easily formed between signal lines and the coupling effect between the signal lines causes signal crosstalk, the displayed image of the TFT liquid crystal display device has horizontal stripes.

SUMMARY

According to an aspect of the present disclosure, there is provided a display panel, comprising a first substrate and a second substrate opposite the first substrate; a patterned black matrix layer between the first substrate and the second substrate, wherein the patterned black matrix layer comprises a hollow area, and an array of signal lines on a side of the first substrate adjacent to the second substrate, wherein the array of signal lines comprises a feedback signal line for common electrode and a clock signal line. The display panel is divided into a display region in a center of the display panel and a frame region surrounding the display region, and the array of signal lines is in the frame region. The frame region comprises a first region and a second region, the feedback signal line for common electrode is in the first region, and the clock signal line is in the second region. The hollow area of the patterned black matrix layer is in the frame region. An orthographic projection of at least one of the first region and the second region on the first substrate at least partially overlaps an orthographic projection of the hollow area on the first substrate.

In some embodiments, the patterned black matrix layer is on a side of the array of signal lines away from the first substrate, or on a side of the second substrate adjacent to the first substrate.

In some embodiments, the clock signal line and the feedback signal line for common electrode are directly adjacent to each other, and the orthographic projection of at least one of the first region and the second region on the first substrate completely coincides with the orthographic projection of the hollow area on the first substrate.

In some embodiments, the array of signal lines further comprises a sub-array of signal lines between the clock signal line and the feedback signal line for common electrode, and the second region comprises a first sub-region and a second sub-region, wherein the sub-array of signal lines is in the first sub-region and the clock signal line is in the second sub-region.

In some embodiments, an orthographic projection of at least one of the first region, the first sub-region and the second sub-region on the first substrate completely coincides with the orthographic projection of the hollow area on the first substrate.

In some embodiments, the first sub-region comprises a first part and a second part, among which the first part is closer to the clock signal line and the second part is closer to the feedback signal line for common electrode, and an orthographic projection of the first part or the second part on the first substrate completely coincides with the orthographic projection of the hollow area on the first substrate.

In some embodiments, the patterned black matrix layer is made of a first black matrix material, the hollow area is filled with a second black matrix material, and a resistivity of the second black matrix material is greater than a resistivity of the first black matrix material.

In some embodiments, a shape of the orthographic projection of the hollow area on the first substrate comprises a ring.

In some embodiments, a width of the first part or the second part is 15-25 microns.

According to another aspect of the present disclosure, there is provided a display device, comprising the display panel according to any one of the embodiments of the disclosure.

According to yet another aspect of the present disclosure, there is provided a method for manufacturing a display panel, wherein the display panel comprises a display region in a center of the display panel and a frame region surrounding the display region, and the frame region comprises a first region and a second region, and the method comprises: providing a first substrate and a second substrate; forming an array of signal lines in the frame region on a side of the first substrate; forming a patterned black matrix layer on a side of the array of signal lines away from the first substrate or on a side of the second substrate, wherein the patterned black matrix layer comprises a hollow area in the frame region; and assembling the first substrate and the second substrate, such that the array of signal lines and the patterned black matrix layer are between the first substrate and the second substrate. The array of signal lines comprises a feedback signal line for common electrode and a clock signal line, the feedback signal line for common electrode is formed in the first region and the clock signal line is formed in the second region, and an orthographic projection of at least one of the first region and the second region on the first substrate at least partially overlaps an orthographic projection of the hollow area on the first substrate.

BRIEF DESCRIPTION OF THE DRAWINGS

The drawings are used to provide a further understanding of the technical solutions of the present disclosure and constitute a part of the specification. The drawings are used together with the embodiments of the present application to explain the technical solutions in the present disclosure, but do not constitute any limitation to the technical solutions in the present disclosure.

DETAILED DESCRIPTION OF THE EMBODIMENTS

In order to make the objects, technical solutions and advantages of the present disclosure more clear, the embodiments of the present disclosure will be described in detail below with reference to the accompanying drawings. It should be noted that, the embodiments of the present application or the features in the embodiments may be arbitrarily combined with each other, unless there is a conflict between the embodiments.

The steps shown in the accompanying flowcharts can be performed on a computer system, such as a set of computers, which can be used to execute instructions. Moreover, although logical sequences are shown in the flowcharts, the shown or described steps may be performed, in certain situations, in a sequence different from those described herein.

Unless otherwise defined, technical or scientific terms used in the embodiments of the present disclosure should be construed in the ordinary meaning understood by those of ordinary skill in the art of the present disclosure. The terms such as "first", "second" and similar terms used in the embodiments of the present disclosure do not express any sequence, quantity, or priority, but are used to distinguish different components. The terms such as "including" or "comprising" are intended to express that the element in front of these terms contains the elements or objects listed following these terms or the equivalents of the elements or objects, without excluding other elements or objects. Terms such as "upper", "lower", "left", "right" etc., are used merely to indicate relative positional relationships. Therefore, in case that the definite position of the described object changes, the relative positional relationships may change accordingly.

Figure 1:
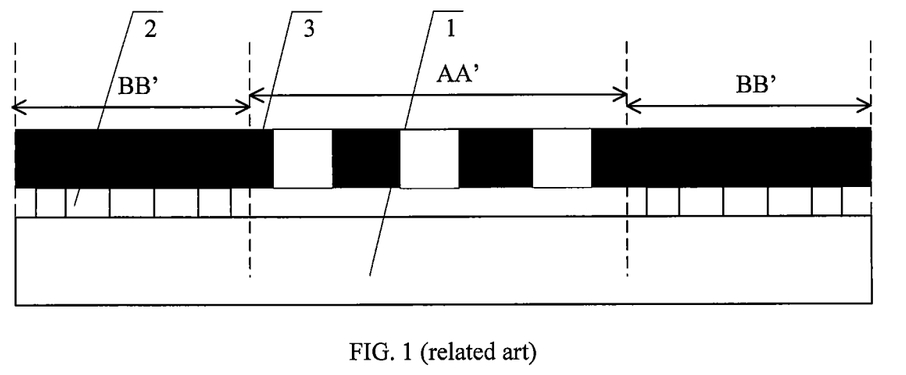
FIG. 1 schematically shows a cross-sectional view of a display panel according to the related art.

FIG. 1 schematically shows a cross-sectional view of a display panel according to the related art. As shown in FIG. 1, the display panel includes a display region AA' which is at the center of the display panel and a frame region BB' surrounding the display region AA'. In terms of the stacked structure of the layers, the display panel of FIG. 1 comprises a base substrate 1, an array of signal lines 2, and a patterned black matrix layer 3, that are arranged sequentially from bottom to top of the display panel. Specifically, the array of signal lines may comprise signal lines such as a clock signal line, a feedback signal line for common electrode, a common electrode signal line and a ground line, etc. Typically, a black matrix layer is placed over all signal lines. After an actual measurement and verification, it has been found that in the above display device, the feedback signal line for common electrode and the clock signal line can form a coupling capacitance through the black matrix layer, thereby causing signal crosstalk and generating horizontal stripes.

To reduce the coupling capacitance, a solution that can be tried is to increase the distance between the feedback signal line for common electrode and the clock signal line. However, the related display devices are mostly narrow bezel products or bezel-less products, which leaves no more room to increase the distance between the feedback signal line for common electrode and the clock signal line. Therefore, it is impossible to further reduce the coupling capacitance between, for example, the feedback signal line for common electrode and the clock signal line and to avoid the generation of horizontal stripes.

In view of the above analysis, in order to, for example, reduce or even eliminate the coupling capacitance in a display device to avoid the generation of horizontal stripes, the embodiments of the present disclosure provide a display panel, a method for manufacturing the display panel, and a corresponding display device.

Figure 2A:
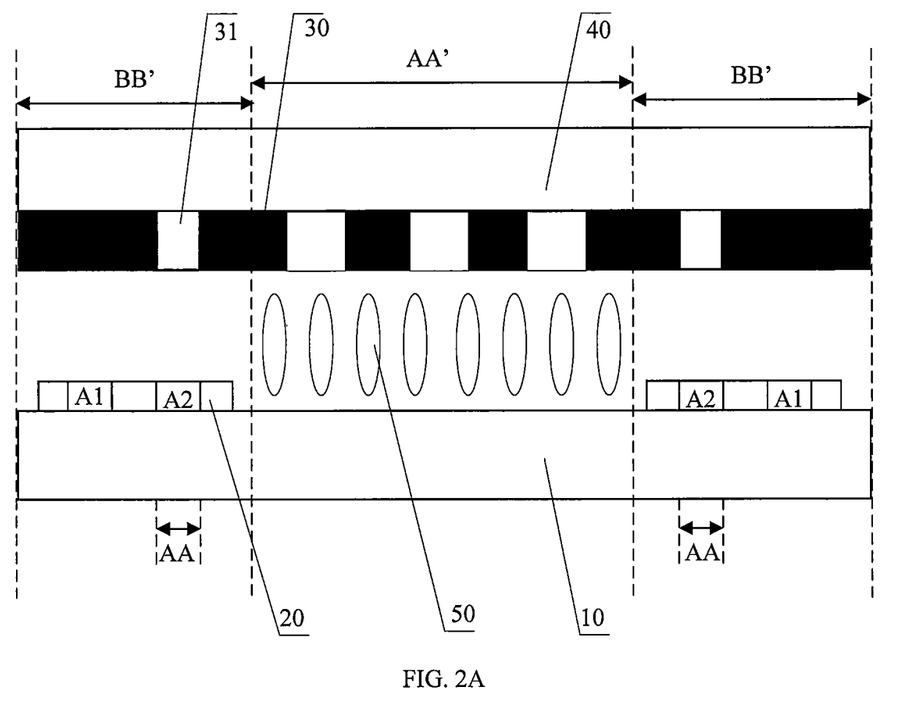
FIG. 2A schematically illustrates a cross-sectional view of a display panel according to an embodiment of the present disclosure.
Figure 2B:
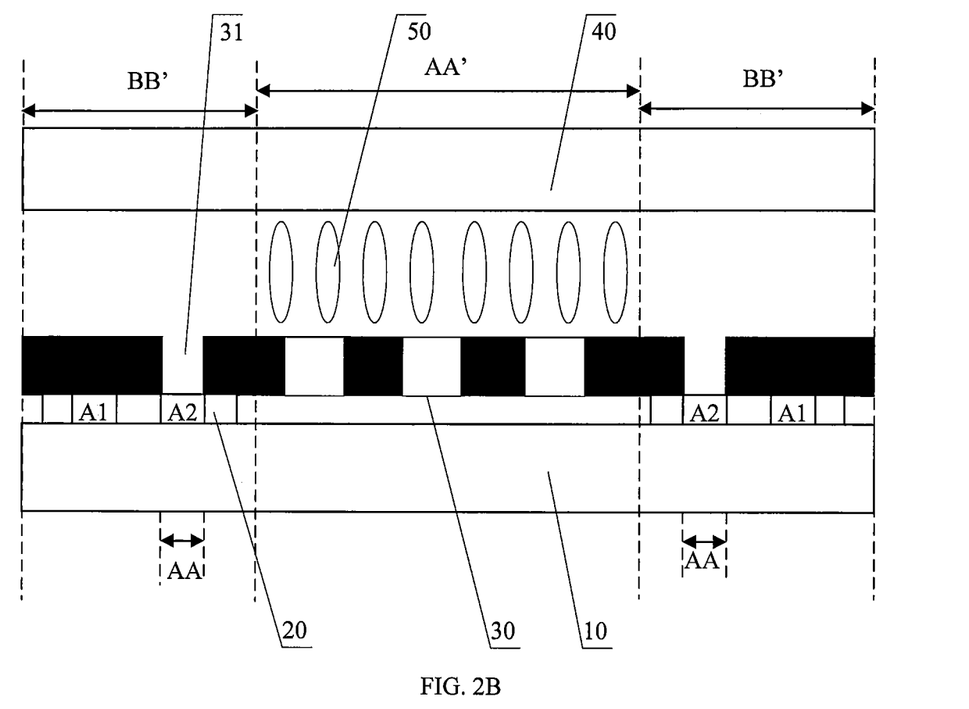
FIG. 2B schematically illustrates a cross-sectional view of a display panel according to another embodiment of the present disclosure.

According to an embodiment of the present disclosure, a display panel is provided. FIG. 2A schematically illustrates a cross-sectional view of a display panel according to an embodiment of the present disclosure, and FIG. 2B schematically illustrates a cross-sectional view of a display panel according to another embodiment of the present disclosure. As shown in FIG. 2A and FIG. 2B, in the embodiments of the present disclosure, the display panel comprises a first substrate 10 and a second substrate 40 that is disposed opposite the first substrate 10. The display panel further comprises an array of signal lines 20 disposed on an upper surface of the first substrate 10, and a patterned black matrix layer 30 disposed over the upper surface of the first substrate 10 (e.g., FIG. 2B) or dispose on a side of the second substrate 40 closer to the lower surface of the second substrate 40 (e.g., FIG. 2A). In addition, the entire display panel is divided into two portions, namely the display region AA' in the center and the frame region BB' in the periphery.

Specifically, the array of signal lines comprises a clock signal line and a feedback signal line for common electrode. The frame region BB' of the display panel comprises a first region A1 that is provided with the feedback signal line for common electrode and a second region A2 that is provided with the clock signal line. Further, the patterned black matrix layer 30 comprises a hollow area 31 that is located in the frame region BB'. There is an overlapping area AA between the orthographic projection of at least one of the first region A1 and the second region A2 on the first substrate 10 and the orthographic projection of the hollow area 31 on the first substrate 10, i.e., the orthographic projection of at least one of the first region A1 and the second region A2 on the first substrate 10 at least partially overlaps the orthographic projection of the hollow area 31 on the first substrate 10. It should be noted the term having a form of "at least one of A and B" should be understood as comprising the following three embodiments: only A, only B and both A and B. For example, the term of "at least one of the first region A1 and the second region A2" comprises the embodiments of "only the first region", "only the second region", and "both the first region and the second region".

In an embodiment of the present disclosure, the display panel further comprises a liquid crystal layer 50 disposed between the first substrate 10 and the second substrate 40.

It should be noted that, in the embodiments of the present disclosure, the expression such as "the patterned black matrix layer comprises a hollow area" means that a blank area, in which no black matrix material is disposed, is provided in the patterned black matrix layer. That is, an opening exists in the patterned black matrix layer. As such, as shown in FIG. 2B for example, since the existence of the hollow area 31 in the patterned black matrix layer 30, signal interference formed by means of the black matrix layer will no longer exist between the clock signal line and the feedback signal line for common electrode.

Optionally, one or both of the first substrate 10 and the second substrate 40 may be a glass substrate, a quartz substrate, a plastic substrate, or the like. The embodiments of the present disclosure have no limitation in this regard in any way. It should be noted that the illustration of FIG. 2A is based on the embodiment in which the patterned black matrix layer is disposed on the second substrate, and the illustration of FIG. 2B is based on the example in which the patterned black matrix layer is disposed on the first substrate. The embodiments of the present disclosure also have no limitation in this regard in any way.

Optionally, the array of signal lines may also comprises other signal lines, such as the initial signal line, the ground line, and the like. In addition, the amount of the clock signal line may be one or more, which is not limited by the embodiments of the present disclosure. The amount of the feedback signal line for common electrode may be one or more, which is not limited by the embodiments of the present disclosure. Moreover, the signal lines can take any suitable arrangement. As an example, the clock signal line can be placed on the side of the feedback signal line for common electrode adjacent to the display region. Alternatively, the clock signal line can also be placed on the side of the feedback signal line for common electrode away from the display region. The illustrations of FIG. 2A and FIG. 2B are based on the examples in which the clock signal line is placed on the side of the feedback signal line for common electrode adjacent to the display region, and the embodiments of the present disclosure are not limited thereto.

In an embodiment of the present disclosure, there is an overlapping area between the orthographic projection of at least one of the first region A1 and the second region A2 on the first substrate 10 and the orthographic projection of the hollow area 31 on the first substrate 10. Specifically, this may, for example, comprise the following situations: a) the orthographic projection of the first region A1 on the first substrate 10 coincides with the orthographic projection of the hollow area 31 on the first substrate 10, b) the orthographic projection of the second region A2 on the first substrate 10 coincides with the orthographic projection of the hollow area 31 on the first substrate 10, c) the orthographic projection of the combination of the first region A1 and the second region A2 on the first substrate 10 coincides with the orthographic projection of the hollow area 31 on the first substrate 10, d) the orthographic projection of the second region A2 on the first substrate 10 overlaps partially with the orthographic projection of the hollow area 31 on the first substrate 10, and the like. The embodiments of the present disclosure have no other limitation in this regard, as long as no coupling capacitance is formed between the clock signal line and the feedback signal line for common electrode, or the formed coupling capacitance is relatively small. Thereby, mutual coupling between the clock signal line and the feedback signal line for common electrode can be reduced or even eliminated, such that the signal crosstalk between signal lines is reduced. It should be noted that the illustrations of FIG. 2A and FIG. 2B are based on the examples in which the orthographic projection of the second region A2 on the first substrate 10 is completely coincident with the orthographic projection of the hollow area 31 on the first substrate 10, and the embodiment of the present disclosure is not limited thereto. The term "coincide" should be understood as that, in at least one dimension, the start points of two elements are coincident and the end points of the two elements are coincident.

Embodiments of the present disclosure provide a display panel which comprises a first substrate and a second substrate opposite the first substrate, an array of signal lines disposed on the first substrate, and a patterned black matrix layer disposed on the first substrate or the second substrate. Further, the array of signal lines comprises a clock signal line and a feedback signal line for common electrode, and the frame region of the display panel comprises the first region provided with the feedback signal line for common electrode and the second region provided with the clock signal line. The patterned black matrix layer comprises a hollow area located in the frame region. There is an overlapping area between the orthographic projection of at least one of the first region and the second region on the first substrate and the orthographic projection of the hollow area on the first substrate. According to an embodiment of the present disclosure, by setting the overlapping area between the orthographic projection of at least one of the first region and the second region on the first substrate and the orthographic projection of the hollow area on the first substrate, it is possible to avoid the formation of the coupling capacitance between the clock signal line and the feedback signal line for common electrode, and eliminate the problem of horizontal stripes.

Optionally, in an embodiment, the patterned black matrix layer is disposed on the first substrate, that is, the patterned black matrix layer is located on a side of the array of signal lines away from the first substrate.

Optionally, in another embodiment, the patterned black matrix layer is disposed on the second substrate, that is, the patterned black matrix layer is located on a side of the second substrate adjacent to the first substrate.

Figure 3:
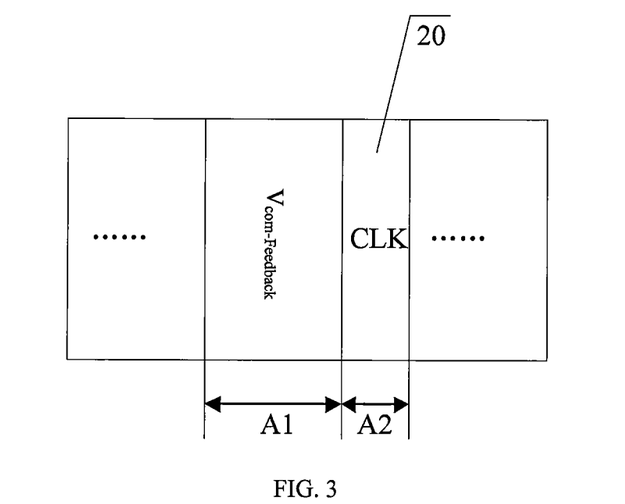
FIG. 3 schematically illustrates a partial top view of an array of signal lines in a display panel according to an embodiment of the present disclosure.

FIG. 3 schematically illustrates a partial top view of an array of signal lines in a display panel according to an embodiment of the present disclosure. As shown in FIG. 3, in the display panel according to the embodiment of the present disclosure, the clock signal line CLK and the feedback signal line for common electrode $V_{com\text{-}feedback}$ in the array of signal lines are directly adjacent to each other. The term "directly adjacent" means there is no other element between the two elements connected by this term.

Figure 4A:
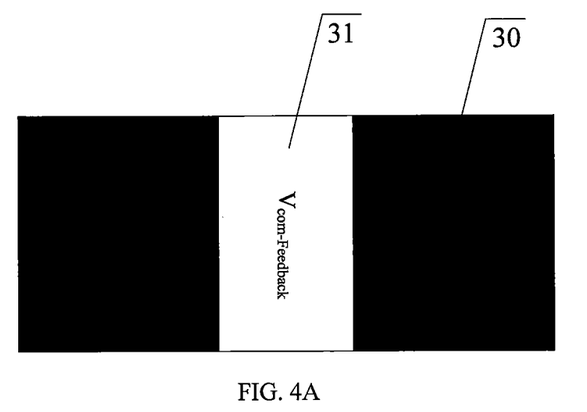
FIG. 4A schematically illustrates a partial top view of a display panel according to an embodiment of the present disclosure.
Figure 4B:
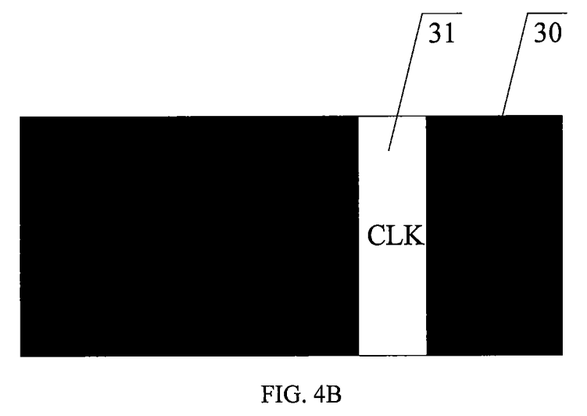
FIG. 4B schematically illustrates a partial top view of a display panel according to an embodiment of the present disclosure.
Figure 4C:
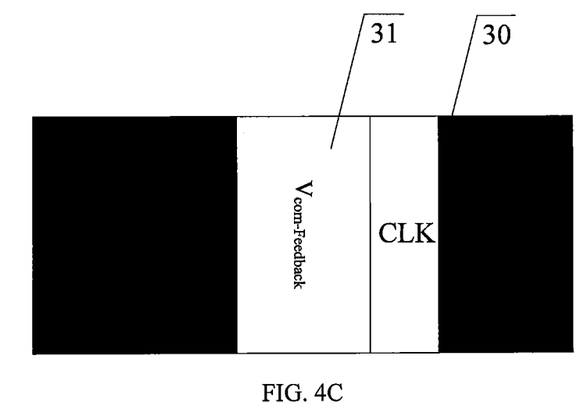
FIG. 4C schematically illustrates a partial top view of a display panel according to an embodiment of the present disclosure.

In an embodiment of the present disclosure, the orthographic projection of at least one of the first region A1 and the second region A2 on the first substrate completely coincides with the orthographic projection of the hollow area on the first substrate. Specifically, FIG. 4A schematically illustrates a partial top view of a display panel according to an embodiment of the present disclosure. The illustration of FIG. 4A is based on the example in which the orthographic projection of the first region A1 on the first substrate completely coincides with the orthographic projection of the hollow area 31 on the first substrate. Further optionally, FIG. 4B schematically illustrates a partial top view of a display panel according to an embodiment of the present disclosure. The illustration of FIG. 4B is based on the example in which the orthographic projection of the second region A2 on the first substrate completely coincides with the orthographic projection of the hollow area 31 on the first substrate. Alternatively, FIG. 4C schematically illustrates a partial top view of a display panel according to an embodiment of the present disclosure. The illustration of FIG. 4C is based on the example in which the orthographic projection of the combination of the first region A1 and the second region A2 on the first substrate completely coincides with the orthographic projection of the hollow area on the first substrate.

In an embodiment of the present disclosure, the clock signal line CLK and the feedback signal line for common electrode $V_{com\text{-}feedback}$ are directly adjacent, and the orthographic projection of at least one of the first region A1 and the second region A2 on the first substrate completely coincides with the orthographic projection of the hollow area on the first substrate. In this case, the coupling capacitance is no longer formed between the clock signal line CLK and the feedback signal line for common electrode $V_{com\text{-}feedback}$, thereby eliminating the coupling effect between the clock signal line CLK and the feedback signal line for common electrode $V_{com\text{-}feedback}$, reducing the signal crosstalk between signal lines and preventing the generation of horizontal stripes.

It should be noted that the array of signal lines can also comprise a first sub-array of signal lines that is disposed a side of the feedback signal line for common electrode $V_{com\text{-}feedback}$ away from the clock signal line CLK and a second sub-array of signal lines disposed at a side of the clock signal line CLK away from the feedback signal line for common electrode $V_{com\text{-}feedback}$.

It should be noted that, in some embodiments of the present disclosure, the orthographic projection of the hollow area on the first substrate may cover the orthographic projection of the first sub-array of signal lines and/or the second sub-array of signal lines on the first substrate. Alternatively, in other embodiments, the orthographic projection of the hollow area on the first substrate may not cover the orthographic projection of the first sub-array of signal lines and/or the second sub-array of signal lines on the first substrate. The illustrations of FIG. 4A-4C are based on the examples in which there is no overlapping area between the orthographic projection of the hollow area on the first substrate and the orthographic projections of the first sub-array of signal lines and the second sub-array of signal lines on the first substrate, and the embodiments of the disclosure are not limited thereto.

Optionally, in order to ensure that the signal lines are not visible to the user, the orthographic projection of the hollow area on the first substrate is designed to not cover the orthographic projections of the first sub-array of signal lines and the second sub-array of signal lines on the first substrate.

Figure 5:
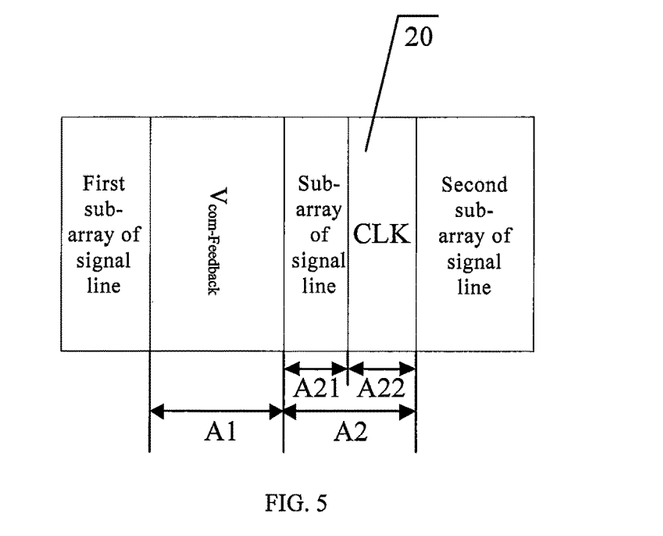
FIG. 5 schematically illustrates a partial top view of an array of signal lines in a display panel according to an embodiment of the present disclosure.

Further optionally, as another embodiment, FIG. 5 schematically illustrates a partial top view of an array of signal lines in a display panel according to an embodiment of the present disclosure. As shown in FIG. 5, in the display panel according to the embodiment of the present disclosure, the array of signal lines can also comprise a sub-array of signal lines disposed between the clock signal line CLK and the feedback signal line for common electrode $V_{com\text{-}feedback}$.

Specifically, the second region A2 may comprise a first sub-region A21 provided with the sub-array of signal lines and a second sub-region A22 provided with the clock signal line CLK.

In addition, as shown in FIG. 5, the array of signal lines can also comprise a first sub-array of signal lines disposed at a side of the feedback signal line for common electrode $V_{com\text{-}feedback}$ away from the clock signal line CLK, and a second sub-array of signal lines disposed at a side of the clock signal line CLK away from the feedback signal line for common electrode $V_{com\text{-}feedback}$.

Optionally, the orthographic projection of at least one of the first region A1, the first sub-region A21 and the second sub-region A22 on the first substrate completely coincides with the orthographic projection of the hollow area on the first substrate.

Figure 6A:
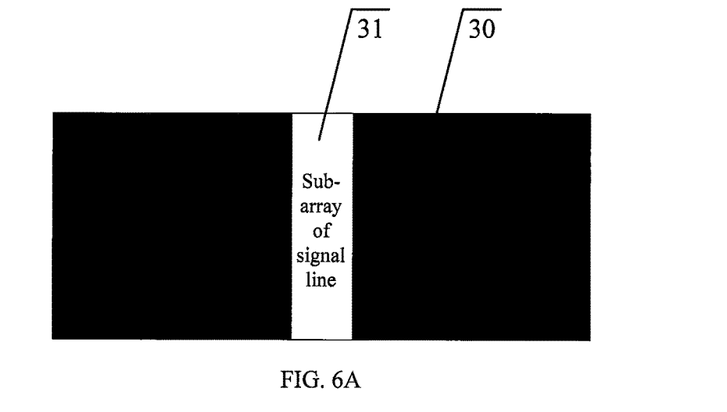
FIG. 6A schematically illustrates a partial top view of a display panel according to an embodiment of the present disclosure.
Figure 6B:
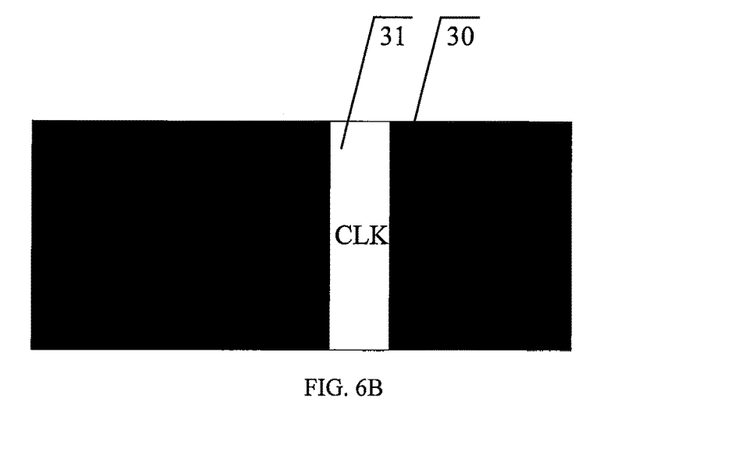
FIG. 6B schematically illustrates a partial top view of a display panel according to an embodiment of the present disclosure.
Figure 6C:
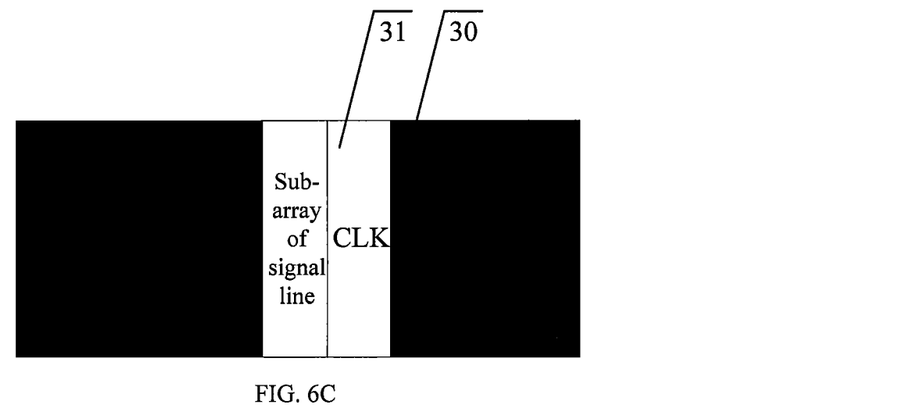
FIG. 6C schematically illustrates a partial top view of a display panel according to an embodiment of the present disclosure.

Optionally, in some embodiments of the present disclosure, the orthographic projection of at least one of the first sub-region A21 and the second sub-region A22 on the first substrate completely coincides with the orthographic projection of the hollow area 31 on the first substrate. Specifically, FIG. 6A schematically illustrates a partial top view of a display panel according to an embodiment of the present disclosure. The illustration of FIG. 6A is based on the example in which the orthographic projection of the first sub-region A21 on the first substrate completely coincides with the orthographic projection of the hollow area 31 on the first substrate. Alternatively, FIG. 6B schematically illustrates a partial top view of a display panel according to an embodiment of the present disclosure. The illustration of FIG. 6B is based on the example in which the orthographic projection of the second sub-region A22 on the first substrate completely coincides with the orthographic projection of the hollow area 31 on the first substrate. Further, FIG. 6C schematically illustrates a partial top view of a display panel according to an embodiment of the present disclosure. The illustration of FIG. 6C is based on the example in which the orthographic projection of the combination of the first sub-region A21 and the second sub-region A22 on the first substrate completely coincides with the orthographic projection of the hollow area 31 on the first substrate.

It should be noted that, in some embodiments of the present disclosure, the orthographic projection of the hollow area on the first substrate may cover the orthographic projection of the first sub-array of signal lines and/or the second sub-array of signal lines on the first substrate. Alternatively, in other embodiments, the orthographic projection of the hollow area on the first substrate may also not cover the orthographic projection of the first sub-array of signal lines and/or the second sub-array of signal lines on the first substrate. The illustrations of FIG. 6A-6C are based on the examples in which there is no overlapping area between the orthographic projection of the hollow area on the first substrate and the orthographic projection of the first sub-array of signal lines and the second sub-array of signal lines on the first substrate, and the embodiments of the present disclosure are not limited thereto.

Figure 6D:
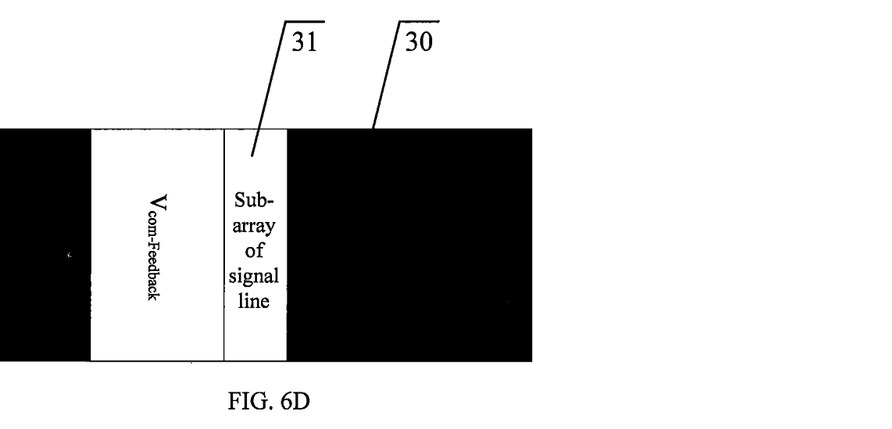
FIG. 6D schematically illustrates a partial top view of a display panel according to an embodiment of the present disclosure.
Figure 6E:
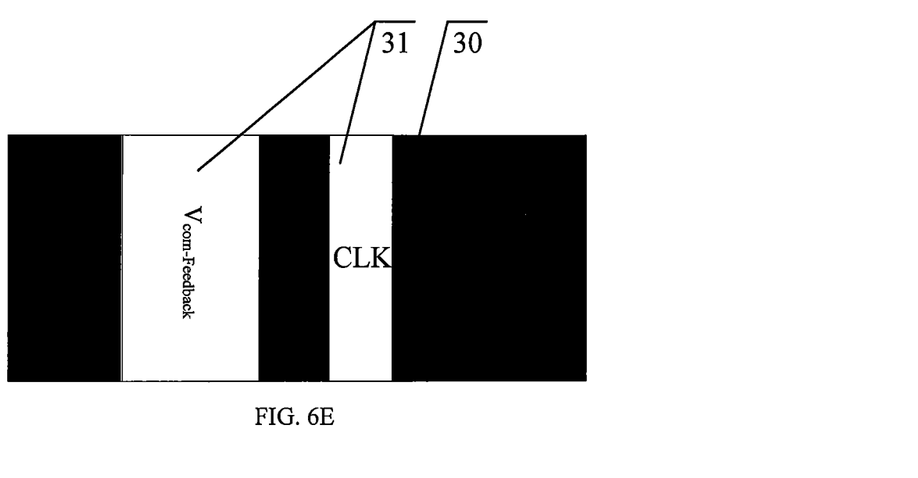
FIG. 6E schematically illustrates a partial top view of a display panel according to an embodiment of the present disclosure.
Figure 6F:
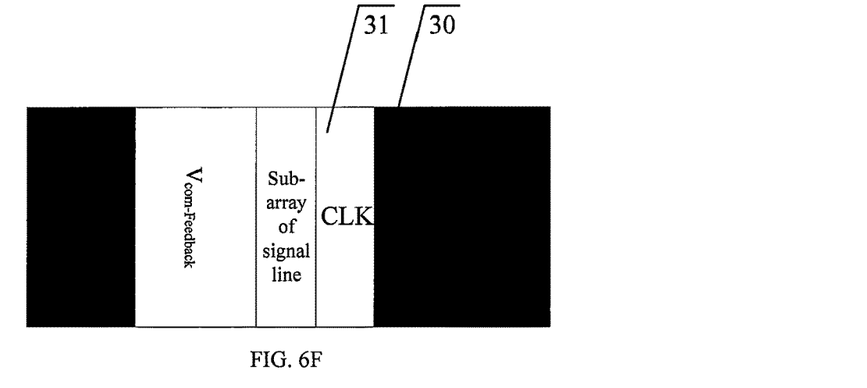
FIG. 6F schematically illustrates a partial top view of a display panel according to an embodiment of the present disclosure.

Optionally, in some embodiments of the present disclosure, the orthographic projection of the first region A1 on the first substrate completely coincides with the orthographic projection of the hollow area 31 on the first substrate. Alternatively, the orthographic projection of at least one of the first sub-region A21 and the second sub-region A22 on the first substrate completely coincides with the orthographic projection of the hollow area 31 on the first substrate. Specifically, FIG. 6D schematically illustrates a partial top view of a display panel according to an embodiment of the present disclosure. The illustration of FIG. 6D is based on the example in which the orthographic projection of the combination of the first region A1 and the first sub-region A21 on the first substrate completely coincides with the orthographic projection of the hollow area 31 on the first substrate. Alternatively, FIG. 6E schematically illustrates a partial top view of a display panel according to an embodiment of the present disclosure. The illustration of FIG. 6E is based on the example in which the orthographic projection of the combination of the first region A1 and the second sub-region A22 on the first substrate completely coincides with the orthographic projection of the hollow area 31 on the first substrate. Further, FIG. 6F schematically illustrates a partial top view of a display panel according to an embodiment of the present disclosure. The illustration of FIG. 6F is based on the example in which the orthographic projection of the combination of the first region A1, the first sub-region A21, and the second sub-region A22 on the first substrate completely coincides with the orthographic projection of the hollow area 31 on the first substrate.

In some embodiments of the present disclosure, the orthographic projection of the hollow area on the first substrate may cover the orthographic projection of the first sub-array of signal lines and/or the second sub-array of signal lines on the first substrate. Alternatively, in other embodiments, the orthographic projection of the hollow area on the first substrate may not cover the orthographic projection of the first sub-array of signal lines and/or the second sub-array of signal lines on the first substrate. The illustrations of FIG. 6D-6F are based on the examples in which there is no overlapping area between the orthographic projection of the hollow area on the first substrate and the orthographic projection of the first sub-array of signal lines and the second sub-array of signal lines on the first substrate, and the embodiments of the present disclosure are not limited thereto.

Figure 6G:
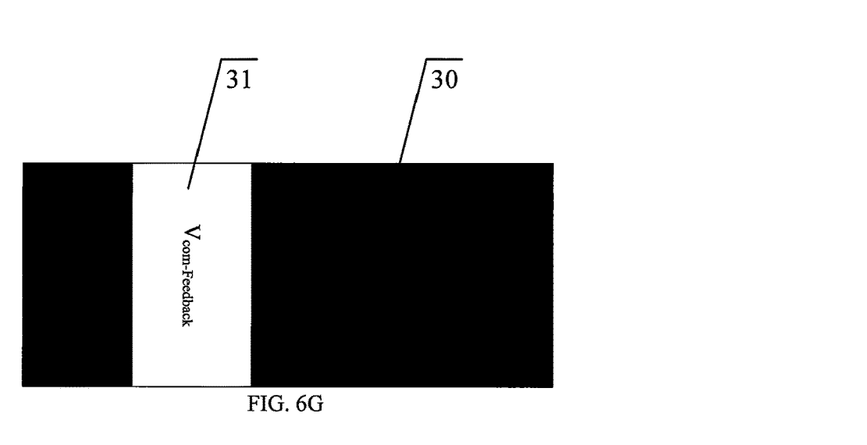
FIG. 6G schematically illustrates a partial top view of a display panel according to an embodiment of the present disclosure.

Optionally, the orthographic projection of the first region A1 on the first substrate completely coincides with the orthographic projection of the hollow area 31 on the first substrate. Specifically, FIG. 6G schematically illustrates a partial top view of a display panel according to an embodiment of the present disclosure. The illustration of FIG. 6G is based on the example in which the orthographic projection of the first region A1 on the first substrate completely coincides with the orthographic projection of the hollow area 31 on the first substrate.

Figure 6H:
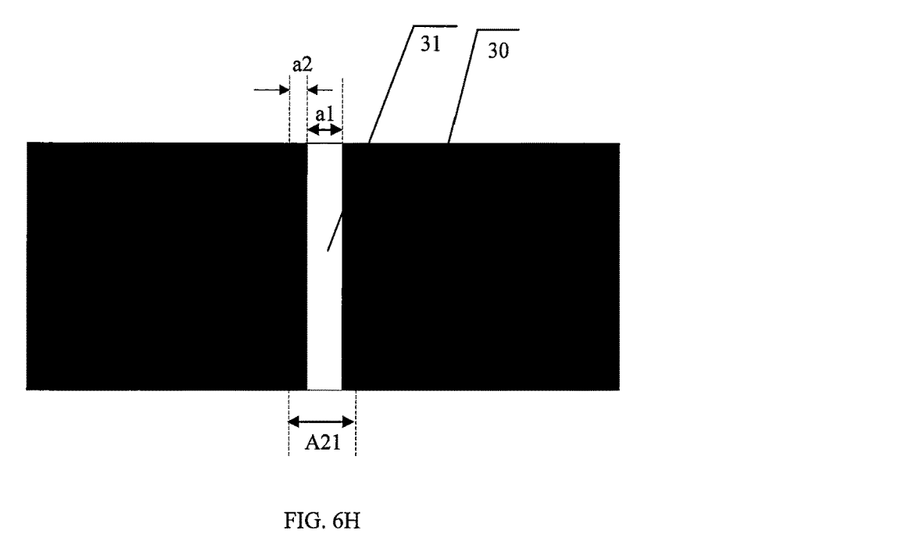
FIG. 6H schematically illustrates a partial top view of a display panel according to an embodiment of the present disclosure.

Optionally, the first sub-region A21 may further comprise, for example, a first part a1 and a second part a2, among which the first part a1 is closer to the clock signal line and the second part a2 is closer to the feedback signal line for common electrode. The orthographic projection of the first part a1 or the second part a2 on the first substrate completely coincides with the orthographic projection of the hollow area 31 on the first substrate. Specifically, FIG. 6H schematically illustrates a partial top view of a display panel according to an embodiment of the present disclosure. The illustration of FIG. 6H is based on the example in which the orthographic projection of the first part a1 on the first substrate completely coincides with the orthographic projection of the hollow area 31 on the first substrate.

Optionally, the width of the first part a1 or the second part a2 is about 15-25 micrometers, preferably 20 micrometer.

Figure 7:
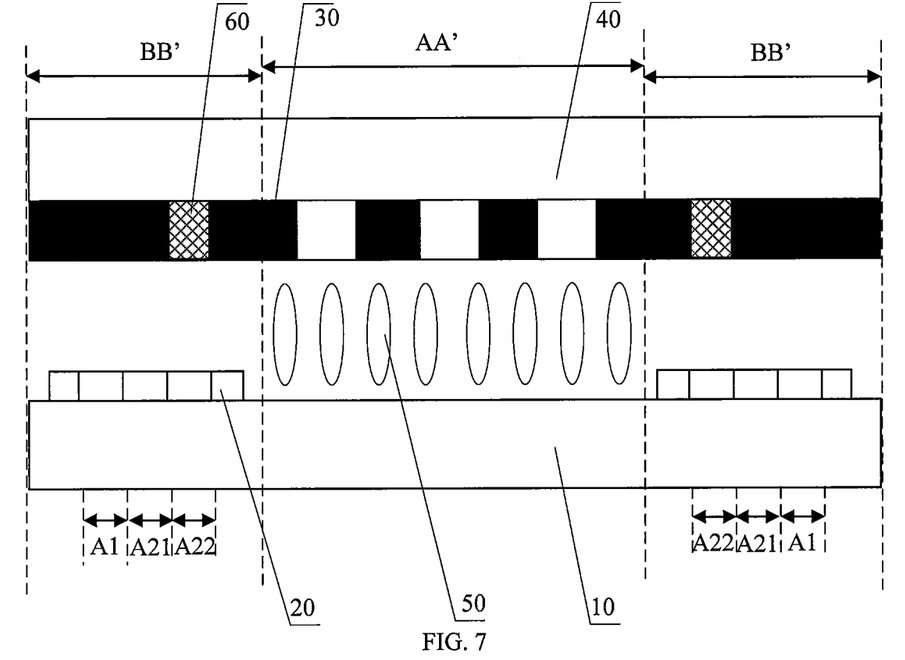
FIG. 7 schematically illustrates a cross-sectional view of a display panel according to an embodiment of the present disclosure.
Figure 8:
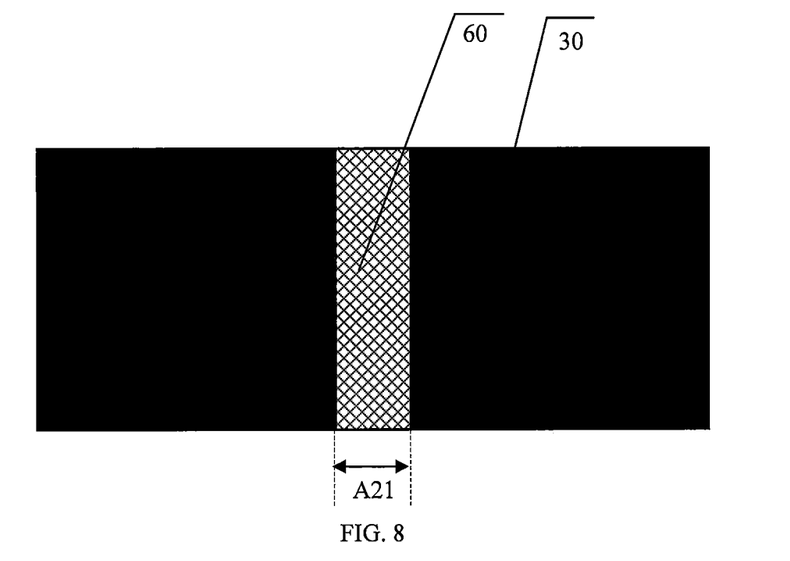
FIG. 8 schematically illustrates a partial top view of the display panel of FIG. 7.

Optionally, FIG. 7 schematically shows a cross-sectional view of a display panel according to an embodiment of the present disclosure, and FIG. 8 shows a corresponding top view of the display panel of FIG. 7. As shown in FIG. 7 and FIG. 8, in the display panel according to the embodiment of the present disclosure, the patterned black matrix layer 30 is made of a first black matrix material, and the hollow area 31 may be filled with a second black matrix material. The resistivity of the second black matrix material is greater than the resistivity of the first black matrix material. In this way, the coupling effect between the feedback signal line for common electrode $V_{com\text{-}feedback}$ and the clock signal line CLK can be reduced.

It should be noted that the illustration of FIG. 7 is based on the example in which the orthographic projection of the second sub-region A22 on the first substrate 10 completely coincides with the orthographic projection of the hollow area on the first substrate 10. Certainly, alternatively, in the display panel according to the embodiment of the present disclosure, it is also possible that the orthographic projection of the first sub-region A21 on the first substrate 10 may be completely coincident with the orthographic projection of the hollow area on the first substrate 10, i.e., the one as shown in FIG. 8. Alternatively, in other embodiments, the orthographic projection of the first region A1 on the first substrate 10 may completely coincide with the orthographic projection of the hollow area on the first substrate 10, or the orthographic projection of the entirety of the second region (i.e., the combination of the first sub-region A21 and the second sub-region A22) on the first substrate 10 coincides with the orthographic projection of the hollow area on the first substrate 10. The embodiments of the present disclosure have no limitation in this regard.

In some embodiments of the present disclosure, the coupling effect between the feedback signal line for common electrode $V_{com\text{-}feedback}$ and the clock signal line CLK can be greatly reduced by using the second black matrix material having a larger resistivity in the hollow area, thereby the horizontal stripes are reduced or even disappeared.

Figure 9:
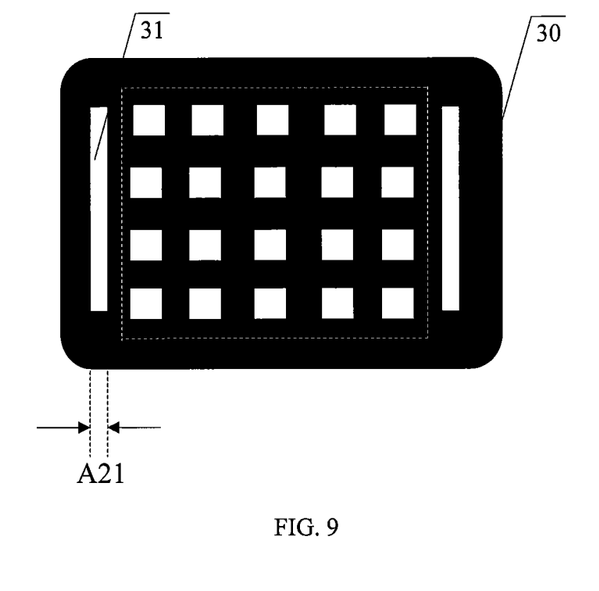
FIG. 9 schematically illustrates a top view of a display panel according to an embodiment of the present disclosure.

It should be noted that FIG. 9 schematically shows a top view of a display panel according to an embodiment of the present disclosure, wherein a central display region of the display panel is schematically illustrated by the white dashed line. As shown in FIG. 9, since the array of signal lines in the display panel are distributed in the frame regions on two sides of the display region, the patterned black matrix layer comprises two longitudinal hollow areas that are located at the frame regions on two sides of the display region. It should be noted that the illustration of FIG. 9 is based on the example in which the orthographic projection of the first sub-region A21 on the first substrate completely coincides with the orthographic projection of the hollow area on the first substrate.

Figure 10:
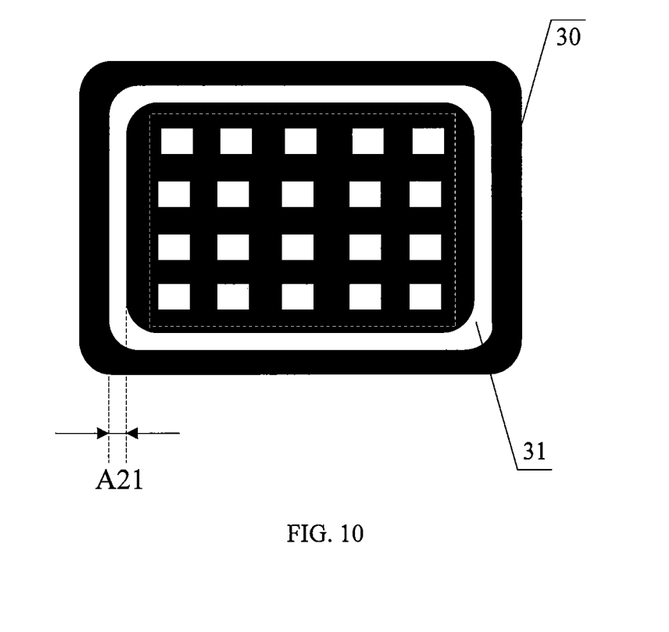
FIG. 10 schematically illustrates a top view of a display panel according to an embodiment of the present disclosure.

Optionally, FIG. 10 schematically shows a top view of a display panel according to an embodiment of the present disclosure, in which, similarly, the central display region of the display panel is schematically shown by means of the white dashed line as well. As shown in FIG. 10, the hollow area 31 is an area with ring shape that is located in the surrounding frame region.

It should be noted that the orthographic projection of the hollow area on the first substrate may cover the orthographic projection of any one or any combination of the first region, the first sub-region (including the first part and the second part), and the second sub-region on the first substrate. The embodiments of the present disclosure have no limitation in this regard. In addition, the illustration of FIG. 10 is based on the example in which the orthographic projection of the first sub-region A21 on the first substrate is covered by the orthographic projection of the hollow area on the first substrate.

In an embodiment of the present disclosure, the hollow area has a shape of ring. In this way, the black matrix layer portion covering the display region and the black matrix layer portion covering the non-display region (i.e., the frame region) are separated from each other, thereby avoiding the signal interference between the black matrix layer portion covering the display region and the black matrix layer portion covering the non-display region, and further enhancing the display effect.

It should be noted that the technical solutions illustrated in FIG. 3 to FIG. 10 can be applied to the display panel in which the patterned black matrix layer is disposed on the first substrate, or applied to the display panel in which the patterned black matrix layer is disposed on the second substrate. The embodiments of the present disclosure have no limitation in this regard.

Figure 11:
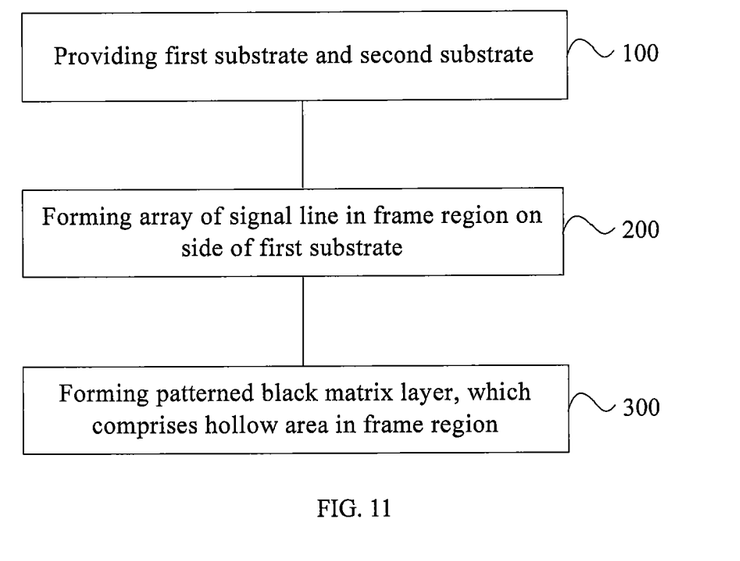
FIG. 11 schematically illustrates a flow chart of a method for manufacturing a display panel according to an embodiment of the present disclosure.

Based on the same inventive concept, the embodiments of the present disclosure further provide a method for manufacturing a display panel. FIG. 11 schematically illustrates a flow chart of a method for manufacturing a display panel according to an embodiment of the present disclosure. As shown in FIG. 11, according to an embodiment of the present disclosure, the display panel comprises a display region at the center of the display panel and a frame region surrounding the display region, and the method for manufacturing the display panel specifically comprises the following steps.

Step 100, providing a first substrate and a second substrate.

Optionally, the first substrate may be a glass substrate, a quartz substrate, a plastic substrate or the like. The embodiments of the present disclosure have no limitation in this regard in any way.

Optionally, the second substrate may also be a glass substrate, a quartz substrate, a plastic substrate or the like. The embodiments of the present disclosure also have no limitation in this regard in any way.

Step 200, forming an array of signal lines in the frame region on a side of the first substrate.

Step 300, forming a patterned black matrix layer which comprises a hollow area in the frame region Optionally, as an embodiment, the patterned black matrix layer may be formed on a side of the second substrate.

Optionally, as another embodiment, the patterned black matrix layer may also be formed on a side of the array of signal lines that is away from the first substrate.

The method may further comprise assembling the first substrate and the second substrate, such that the array of signal lines and the patterned black matrix layer are between the first substrate and the second substrate.

The array of signal lines comprises a clock signal line and a feedback signal line for common electrode. The frame region of the display panel comprises a first region provided with the feedback signal line for common electrode and a second region provided with the clock signal line. The orthographic projection of at least one of the first region and the second region on the first substrate at least partially overlaps with the orthographic projection of the hollow area on the first substrate.

It should be noted that, in the embodiments of the present disclosure, the expression "the patterned black matrix layer comprises a hollow area" means there is a region in the patterned black matrix layer where no black matrix material is disposed. That is, there is an opening in the patterned black matrix layer. Thereby, the signal interference between the clock signal line and the feedback signal line for common electrode can be eliminated by means of the hollow area in the patterned black matrix layer.

The embodiments of the present disclosure provide a method for manufacturing a display panel. The display panel comprises a display region at a center of the display panel and a frame region surrounding the display region. The frame region comprises a first region and a second region. The method comprises providing a first substrate and a second substrate opposite the first substrate; forming a patterned black matrix layer between the first substrate and the second substrate, wherein the patterned black matrix layer comprises a hollow area in the frame region; and, forming an array of signal lines in the frame region on a side of the first substrate adjacent to the second substrate. The array of signal lines comprises a feedback signal line for common electrode and a clock signal line. The feedback signal line for common electrode is formed in the first region and the clock signal line is formed in the second region. An orthographic projection of at least one of the first region and the second region on the first substrate at least partially overlaps an orthographic projection of the hollow area on the first substrate. According to the embodiments of the present disclosure, by setting the orthographic projection of at least one of the first region and the second region on the first substrate to overlap with the orthographic projection of the hollow area on the first substrate, the coupling effect between the clock signal line and the feedback signal line for common electrode may be reduced or even eliminated to reduce signal crosstalk between signal lines and avoid horizontal stripes.

Optionally, as an embodiment, the clock signal line and the feedback signal line for common electrode are directly adjacent, and the patterned black matrix layer is formed such that the orthographic projection of at least one of the first region and the second region on the first substrate coincides with the orthographic projection of the hollow area on the first substrate.

Optionally, as another embodiment, the array of signal lines also comprises a sub-array of signal lines disposed between the clock signal line and the feedback signal line for common electrode, and the second region comprises a first sub-region provided with the sub-array of signal lines and a second sub-region provided with the clock signal line. In this case, the patterned black matrix layer is formed such that the orthographic projection of at least one of the first region, the first sub-region, and the second sub-region on the first substrate coincides with the orthographic projection of the hollow area on the first substrate. Alternatively, the first sub-region may also comprise a first part and a second part among which the first part is closer to the clock signal line and the second part is closer to the feedback signal line for common electrode. The orthographic projection of the first part or the second part on the first substrate coincides with the orthographic projection of the hollow area on the first substrate.

Optionally, as an embodiment of the present disclosure, the method for manufacturing the display panel may also comprise filling the hollow area of the patterned black matrix layer with a second black matrix material, the resistivity of the second black matrix material being greater than the resistivity of the first black matrix material that is used to form the patterned black matrix layer. Thereby, the coupling effect between the feedback signal line for common electrode and the clock signal line can be reduced.

Based on the same inventive concept, the embodiments of the present disclosure further provide a display device, which comprises the display panel described in any of the above embodiments. The implementation principle and effect of such a display device are similar to those of the display panels described above, and will not be described herein.

It should be noted that the display device may be any product or component that has a display function, such as a liquid crystal display (LCD), an electronic paper, an organic light-emitting diode (OLED) display, a mobile phone, a tablet computer, a television, a display, a laptop computer, a digital photo frame or a navigator, etc.

It should be noted that the drawings of the embodiments of the present disclosure refer only to the structures mentioned in the embodiments of the present disclosure, and other structures may refer to the usual designs.

Moreover, for the sake of clarity, in the drawings used to describe embodiments of the present disclosure, the thickness and size of the layers or microstructures have been exaggerated. It can be understood that when an element such as a layer, a film, a region or a substrate etc. is described as being "on" or "below" another element, this element can be directly located on or below the another element, or there may be an intermediate component disposed therebetween.

Moreover, the embodiments of the present disclosure, that is, the features in the embodiments, may be combined with each other to obtain a new embodiment, as long as there is no conflict between the embodiments of the features.

While the embodiments of the present disclosure have been described above, the embodiments are only provided for the purpose of understanding the present disclosure, and are not intended to limit the disclosure. Any modifications and variations in the form and details of the implementation of the embodiments may be made by those skilled in the art without departing from the spirit and scope of the disclosure. However, the scope of protection of the present disclosure is subject to the scope defined by the appended claims.

I claim:

1. A display panel, comprising:
a first substrate and a second substrate opposite the first substrate;
a patterned black matrix layer between the first substrate and the second substrate, wherein the patterned black matrix layer comprises a hollow area; and
an array of signal lines on a side of the first substrate adjacent to the second substrate, wherein the array of signal lines comprises a feedback signal line for common electrode and a clock signal line,
wherein the display panel is divided into a display region in a center of the display panel and a frame region surrounding the display region, and the array of signal lines is in the frame region,
wherein the frame region comprises a first region and a second region,
wherein the feedback signal line for common electrode is in the first region, and the clock signal line is in the second region,
wherein the hollow area of the patterned black matrix layer is in the frame region, and
wherein an orthographic projection of at least one of the first region and the second region on the first substrate at least partially overlaps an orthographic projection of the hollow area on the first substrate.

2. The display panel of claim 1, wherein the patterned black matrix layer is on a side of the array of signal lines away from the first substrate, or on a side of the second substrate adjacent to the first substrate.

3. The display panel of claim 1,
wherein the clock signal line and the feedback signal line for common electrode are directly adjacent to each other, and
wherein the orthographic projection of at least one of the first region and the second region on the first substrate completely coincides with the orthographic projection of the hollow area on the first substrate.

4. The display panel of claim 1,
wherein the array of signal lines further comprises a sub-array of signal lines between the clock signal line and the feedback signal line for common electrode,
wherein the second region comprises a first sub-region and a second sub-region, and
wherein the sub-array of signal lines is in the first sub-region and the clock signal line is in the second sub-region.

5. The display panel of claim 4, wherein an orthographic projection of at least one of the first region, the first sub-region and the second sub-region on the first substrate completely coincides with the orthographic projection of the hollow area on the first substrate.

6. The display panel of claim 4,
wherein the first sub-region comprises a first part and a second part,
wherein the first part is closer to the clock signal line and the second part is closer to the feedback signal line for common electrode, and
wherein an orthographic projection of the first part or the second part on the first substrate completely coincides with the orthographic projection of the hollow area on the first substrate.

7. The display panel according to claim 1,
wherein the patterned black matrix layer is made of a first black matrix material,
wherein the hollow area includes a second black matrix material, and wherein a resistivity of the second black matrix material is greater than a resistivity of the first black matrix material.

8. The display panel according to claim 1, wherein a shape of the orthographic projection of the hollow area on the first substrate comprises a ring.

9. The display panel of claim 6, wherein a width of the first part or the second part is 15-25 microns.

10. A display device, comprising the display panel according to claim 1.

11. A method for manufacturing a display panel, wherein the display panel comprises a display region in a center of the display panel and a frame region surrounding the display region, and wherein the frame region comprises a first region and a second region, the method comprising:

providing a first substrate and a second substrate;

forming an array of signal lines in the frame region on a side of the first substrate;

forming a patterned black matrix layer on a side of the array of signal lines away from the first substrate or on a side of the second substrate adjacent to the first substrate, wherein the patterned black matrix layer comprises a hollow area in the frame region; and assembling the first substrate and the second substrate, such that the array of signal lines and the patterned black matrix layer are between the first substrate and the second substrate, wherein the array of signal lines comprises a feedback signal line for common electrode and a clock signal line, wherein the feedback signal line for common electrode is formed in the first region and the clock signal line is formed in the second region, and wherein an orthographic projection of at least one of the first region and the second region on the first substrate at least partially overlaps an orthographic projection of the hollow area on the first substrate.

\* \* \* \* \*

UNITED STATES PATENT AND TRADEMARK OFFICE
CERTIFICATE OF CORRECTION

| | | |
|---|---|---|
| PATENT NO. | : 11,215,894 B2 | Page 1 of 1 |
| APPLICATION NO. | : 16/611647 | |
| DATED | : January 4, 2022 | |
| INVENTOR(S) | : Di Zhang | |

It is certified that error appears in the above-identified patent and that said Letters Patent is hereby corrected as shown below:

On the Title Page

Item (73) Assignee: Please correct "BEIJING BOE DISPLAY TECHNOLOGY CO., LTD" to read -- BEIJING BOE DISPLAY TECHNOLOGY CO., LTD. --

<div style="text-align: right;">

Signed and Sealed this
Third Day of September, 2024

Katherine Kelly Vidal
*Director of the United States Patent and Trademark Office*

</div>